United States Patent

Boerstler

[11] Patent Number: 5,977,813
[45] Date of Patent: Nov. 2, 1999

[54] TEMPERATURE MONITOR/COMPENSATION CIRCUIT FOR INTEGRATED CIRCUITS

[75] Inventor: David William Boerstler, Round Rock, Tex.

[73] Assignee: International Business Machines Corporation, Armonk, N.Y.

[21] Appl. No.: 08/943,424

[22] Filed: Oct. 3, 1997

[51] Int. Cl.⁶ .................................................. H01L 35/00
[52] U.S. Cl. ........................... 327/378; 327/509; 327/512
[58] Field of Search ...................... 327/530, 378, 327/362, 312, 509, 512, 64, 65, 66; 323/315, 312

[56] References Cited

U.S. PATENT DOCUMENTS

| | | | |
|---|---|---|---|
| 4,464,588 | 8/1984 | Wieser | 327/543 |
| 4,723,108 | 2/1988 | Murphy et al. | 323/315 |
| 4,879,505 | 11/1989 | Barrow et al. | 323/312 |
| 5,357,149 | 10/1984 | Kimura | 327/543 |
| 5,391,979 | 2/1995 | Kajimoto et al. | 327/543 |
| 5,394,026 | 2/1995 | Yu et al. | 327/537 |
| 5,467,052 | 11/1995 | Tsukada | 327/543 |
| 5,488,328 | 1/1996 | Ludwig et al. | 327/513 |
| 5,528,128 | 6/1996 | Melse | 323/315 |
| 5,627,456 | 5/1997 | Novof et al. | 323/315 |
| 5,644,216 | 7/1997 | Lopez et al. | 323/315 |

Primary Examiner—Dinh T. Le
Attorney, Agent, or Firm—Casimer K. Salys; Jack V. Musgrove; Andrew J. Dillon

[57] ABSTRACT

A monitor within an integrated circuit is disclosed for providing a signal which is proportional to an integrated circuits operating environment. A differential gain cell within the integrated circuit is biased with a bias circuit. A first environment sensitive circuit provides a signal to the first input of the differential gain cell and a second environment sensitive circuit provides a signal with a known relationship to the first environment sensitive signal to the second input of the differential gain cell. The signal produced by the second environment sensitive circuit has a known operational relationship with the signal produced by the first environment sensitive circuit such that changes in the integrated circuit operating environment produce a deviation between the two signals. The differential gain cell in response to the signal received on its first input and second input produces a signal which is responsive to the operating environment of the integrated circuit.

18 Claims, 6 Drawing Sheets

TEMPERATURE MONITOR/COMPENSATION CIRCUIT FOR INTEGRATED CIRCUITS

CROSS REFERENCE TO RELATED APPLICATION

The present application is related to copending U.S. patent application Ser. No. 08/901,298, entitled "CMOS Process Compensation Circuit" filed on Jul. 28, 1997 and assigned to the assignee hereon named, is hereby incorporated.

BACKGROUND OF THE INVENTION

1. Technical Field

The present invention relates in general to integrated circuits and in particular to an operating environment monitor circuit providing a signal which can be utilized for compensating application circuits. Still more particularly, the present invention relates to a temperature variation monitor which can provide a reference signal responsive to temperature variations in the operating environment.

2. Description of the Related Art

A primary challenge in designing precision integrated circuits is to control circuit parameters, such as bias currents, in view of temperature variations. During the design of integrated circuits, anticipating and controlling operating fluctuations due to changes in environmental conditions such as temperature, requires a complicated analysis. Temperature sensitivity, fabrication variations and supply voltage variations exhibit complex relationships among each other. In integrated circuits, precision oscillators and more particularly, oscillators with feedback, such as phase lock loop topologies, are designed to comply with precise specifications that have little margin for deviation. Surmounting these tight tolerances over a wide range of temperatures is very challenging and difficult for a designer. Today's integrated circuits require higher accuracy and tighter tolerances due to their lower voltage and higher frequency requirements.

Techniques for stabilization of circuits over the temperature range which the circuit will endure, have received a substantial amount of attention recently. Examples of precision circuits, or circuits which are very sensitive to temperature variations include voltage controlled oscillators, phase lock loops, and switch mode power supply controllers.

Known compensation techniques for circuits requiring accurate oscillations are extensive and diverse. Compensation techniques are typically external to the application circuit. Prior art circuits compensate for temperature variations utilizing indirect methods. Generally, indirect methods sense the deviation of the actual output from the desired output. Indirect methods do not specifically sense the change in operating parameters of the devices which deviate and cause undesirable complications in the output signal. Indirect methods many times utilize resistors and diodes which are external to the semiconductor chip. Hence, compensation is not performed utilizing detection of the source of the problem, but compensation is performed by sensing the adverse effects, which the temperature or voltage variation has created on the desired signal.

Timing problems associated with environmental variations such as temperature are encountered frequently in both digital and analog circuits. Temperature variation can significantly alter the performance characteristics of CMOS circuits, and many times, temperature variations limit system performance.

Circuits which are sensitive to temperature variations, such as voltage-controlled oscillators, can be significantly improved by temperature-independent biasing techniques. However, in many applications this technique is not sufficient to meet the performance requirements. Techniques involving temperature sensing and compensation are complex and usually involve very large gain amplifiers to convert the small sensor signals to larger usable levels.

Other known compensation systems utilize a digital memory and a digital-to-analog converter to generate a reference current for compensation. In these designs, the reference current is utilized to stabilize operation over a given temperature range.

Tighter process tolerances can be adopted to improve device performance and reduce device variability, but tighter tolerances substantially increases the cost of the product. Testing and selection of temperature insensitive devices to isolate acceptable devices is also utilized in the prior art. Selection also increases the cost of the product due to additional testing effort and the corresponding lower yield.

A typical temperature compensation circuit compensates for operating variations utilizing elements in a feedback circuit. Most known temperature compensation circuits are based upon sensor devices to provide feedback which is correlated to the desired operating output of the application circuit or circuit to be compensated.

Known temperature compensation circuits adjust for circuit variations by subsidizing a circuit's output. Hence, present temperature compensation techniques are deficient because they do not monitor actual device parameters, such as transconductance, which drift during temperature variations.

To compensate for temperature variations, complex arrangements have hitherto been required. Hence, a need exists for a simple effective and efficient temperature variation detector or monitor which can be utilized to compensate for operating aberrations due to temperature variations.

SUMMARY OF THE INVENTION

It is therefore one object of the present invention to provide an on-chip monitor for tracking operating variations due to environmental parameter fluctuations.

It is another object of the present invention to provide a temperature monitor which can be utilized to compensate application circuits which manifest operating deviations due to temperature variations.

It is yet another object of the present invention to provide a circuit parameter monitor which can monitor and compensate circuits for the effects of temperature variations.

The foregoing objects are achieved as is now described. A monitor within an integrated circuit is disclosed for providing a signal which is a function of a parameter of an integrated circuit's operating environment. A differential gain cell within the integrated circuit is biased with a bias circuit. A first environment sensitive circuit provides a signal to the first input of the differential gain cell and a second environment sensitive circuit provides a signal with a known relationship to the first environment sensitive signal to the second input of the differential gain cell. The signal produced by the second environment sensitive circuit has a known operational relationship with the signal produced by the first environment sensitive circuit such that changes in the integrated circuit operating environment produce a deviation between the two signals. The differential gain cell in response to the signals received on its first input and second input produces a signal which is responsive to the operating environment parameters of the integrated circuit.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
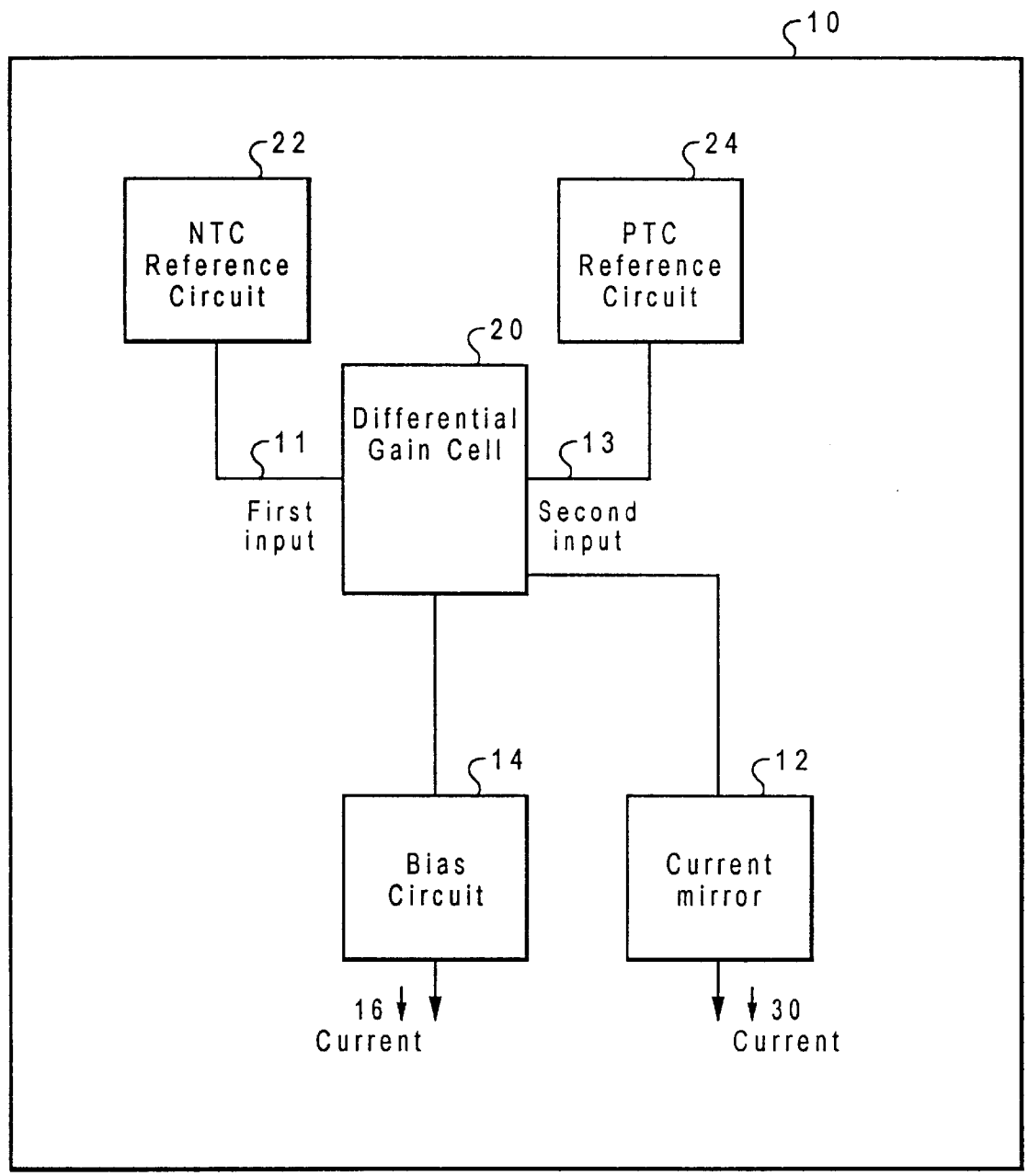
FIG. 1 is a block diagram depicting one embodiment of an environmental variation monitor constructed in accordance with the present invention.

With reference now to the figures and in particular with reference to FIG. 1, a monitor circuit 10 is depicted. A preferred embodiment of monitor circuit 10 is utilized in an integrated circuit to monitor an environmental operating parameter and produce a current 30 which is a function of the parameter. One said parameter is the temperature, however, other parameters such as supply voltage and process variations can also be effectively monitored by monitor circuit 10.

In a preferred embodiment, current mirror 12 provides a current 30 which is a function of the temperature of the integrated circuit substrate in which the components of FIG. 1 reside. Integrated circuits are designed to effectively dissipate heat and to minimize "hot spots" on the substrate. A substrate of an integrated circuit conducts heat, and therefore an integrated circuit maintains a substantially homogeneous operating temperature throughout the substrate. However, certain circuit areas generate more heat than others and monitor circuit 10 could be utilized to detect and/or compensate for temperature gradients within an integrated circuit.

In a preferred embodiment, the application circuit which utilizes monitor current 30 is exposed to substantially identical environment conditions as monitor circuit 10. Therefore, the application circuit which monitor circuit 10 provides compensation for would be placed in close proximity to the monitor circuit 10.

In alternate embodiments, monitor circuit 10 can supply other integrated circuits on separate semiconductor chips with current 30. This embodiment would allow harmonious operation between two different semiconductor chips which might be required to operate under different environmental conditions.

In operation, bias circuit 14 sinks a predetermined amount of current 16. It is desired that bias circuit 14 provide a current which is relatively independent of temperature variations. A temperature-invariant bias current allows a more accurate representation of monitor circuit 10 temperature by current 30.

In a preferred embodiment, differential gain cell 20 is driven on first input 11 by negative temperature coefficient, (NTC), reference circuit 22 which provides a lower voltage for higher temperatures. Differential gain cell 20 is driven on a second input 13 by positive temperature coefficient,(PTC), reference circuit 24. PTC reference circuit 24 provides an increasing voltage with increasing temperature. Increasing temperature causes a corresponding shift in the majority of current 16 from the left side of differential gain cell 20 to the right side of differential gain cell 20. Current mirror 12 replicates the current flow in one side of differential gain cell 20. Current 30 and its relationship to operating temperature is illustrated in FIG. 3B.

Figure 2:
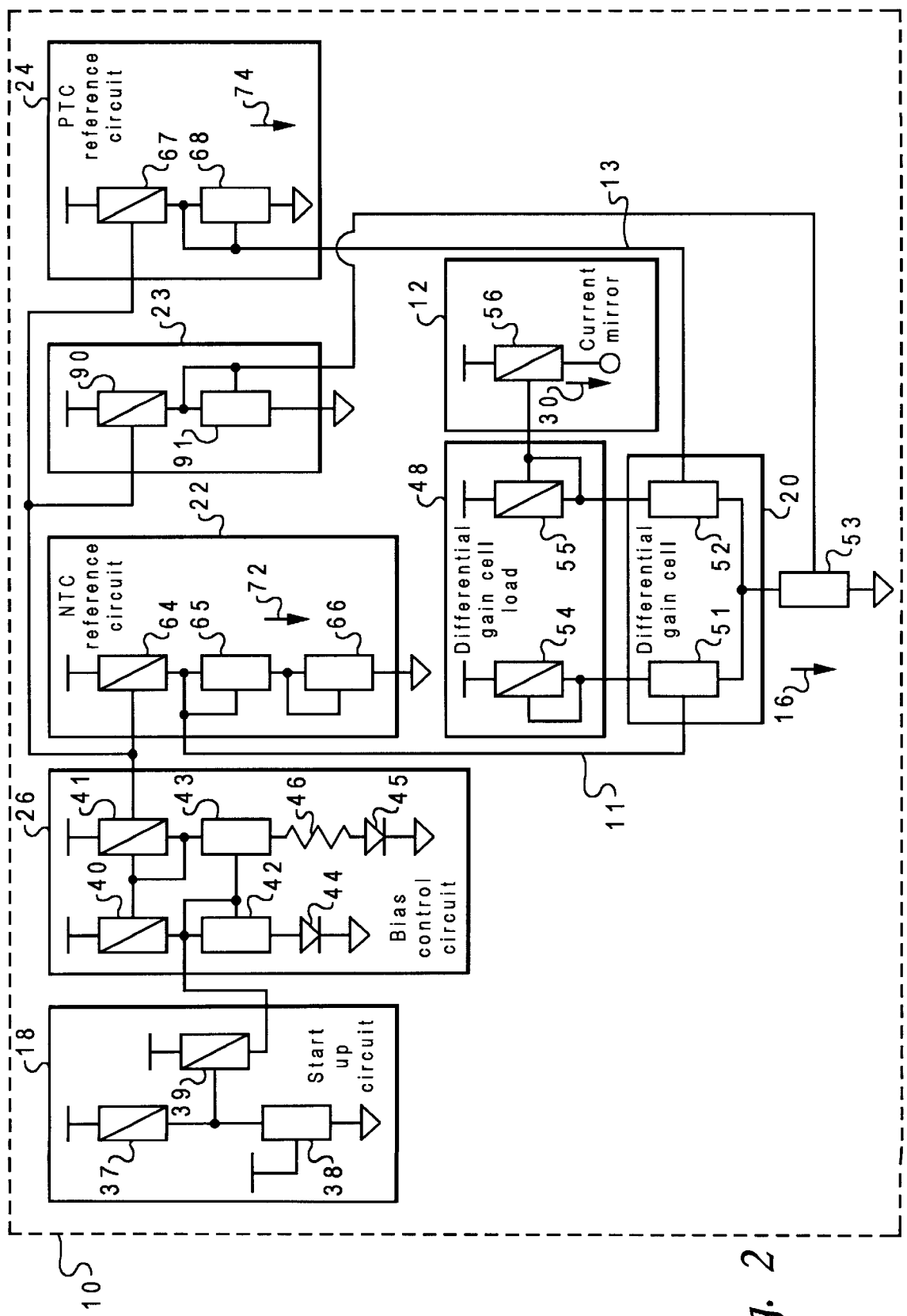
FIG. 2 is a detailed schematic diagram illustrating an embodiment for an environmental variation monitor, implementing the block diagram of FIG. 1, which is specifically adapted for temperature monitoring in accordance with the present invention.

Devices illustrated with a cross-hatch such as 37, 39 and 40 are P-type MOSFETS and devices without a cross-hatch such as 38 and 42 are N-type MOSFETS. FIG. 2 depicts a configuration for a preferred embodiment, however, anyone skilled in the art would understand that other P-fet/N-fet configurations would not part from the scope of the subject invention Transistor 40 is depicted as a four leaded device, however, two gate connections have been illustrated which are identical nodes of the transistors. For instance, transistor 40 has its gate connected to the gate of transistor 37 and the gate of transistor 41. To simplify the illustration in FIG. 2, the gate connections of transistors 40, 41 and 64 are illustrated in duplicate.

Referring to FIG. 2, a more detailed diagram of a preferred embodiment is depicted. Transistors 37, 38 and 39 are included in start-up circuit 18. Start-up circuit 18 ensures a non-zero steady state operation of monitor circuit 10 upon power up.

Bias control circuit 26 consists of transistors 40, 41, 42, 43, diodes 44, 45 and resistor 46. Bias control circuit 26 provides a reference voltage for NTC reference circuit 22, PTC reference circuit 24, and differential gain cell bias 23. Bias control circuit 26 ensures that bias currents 16, 72 and 74 are substantially constant over the desired temperature range.

Resistor 46 has a positive temperature coefficient. Therefore, the resistance of resistor 46 increases with an increase in temperature. Bias control circuit 26 provides a reference voltage to stabilize monitor circuit 10. Bias control circuit 26 provides a current which is substantially stable across temperature, voltage and process variations. Several thousand ppm/° C. change is acceptable to adequately control monitor circuit 10. However, in a preferred embodiment, bias control circuit has +800 ppm/° C. change.

In FIG. 2, differential gain cell bias 23 and current sink 53 illustrate a possible implementation of bias circuit 14 of FIG. 1. Current sink 53, which in a preferred embodiment is realized by a transistor, biases differential gain cell 20. Due to identical gate-to-source voltage of the transistor in current sink 53 and transistor 91, current sink 53 mirrors the current through transistor 91.

The reference current flowing in transistor 41 is mirrored by transistors 64, 67 and 90. Transistor 68 has a low width-to-length ratio. The width-to-length ratio is a physical implementation determined by the mask sizing in the manufacturing operation of the integrated circuit. Hence, transistor 68 is designed to have a relatively high impedance and low threshold voltage. In a preferred embodiment transistor 68 carries approximately 20 uA and is biased above its "zero temperature coefficient point." The "zero temperature coefficient point" will be discussed in detail in a subsequent paragraph.

Transistors 65 and 66 have a higher length to width ratio than transistor 68. Transistors 65 and 66 are designed to have a relatively low impedance and a high threshold voltage. In a preferred embodiment, transistors 65 and 66 are biased with a current of approximately 10 uA. Biasing transistor 65 and transistor 66 at 10 uA, places the operating point of transistors 65 and 66 at a point below their "zero temperature coefficient point". The "zero temperature coefficient point" is discussed below.

Figure 4:
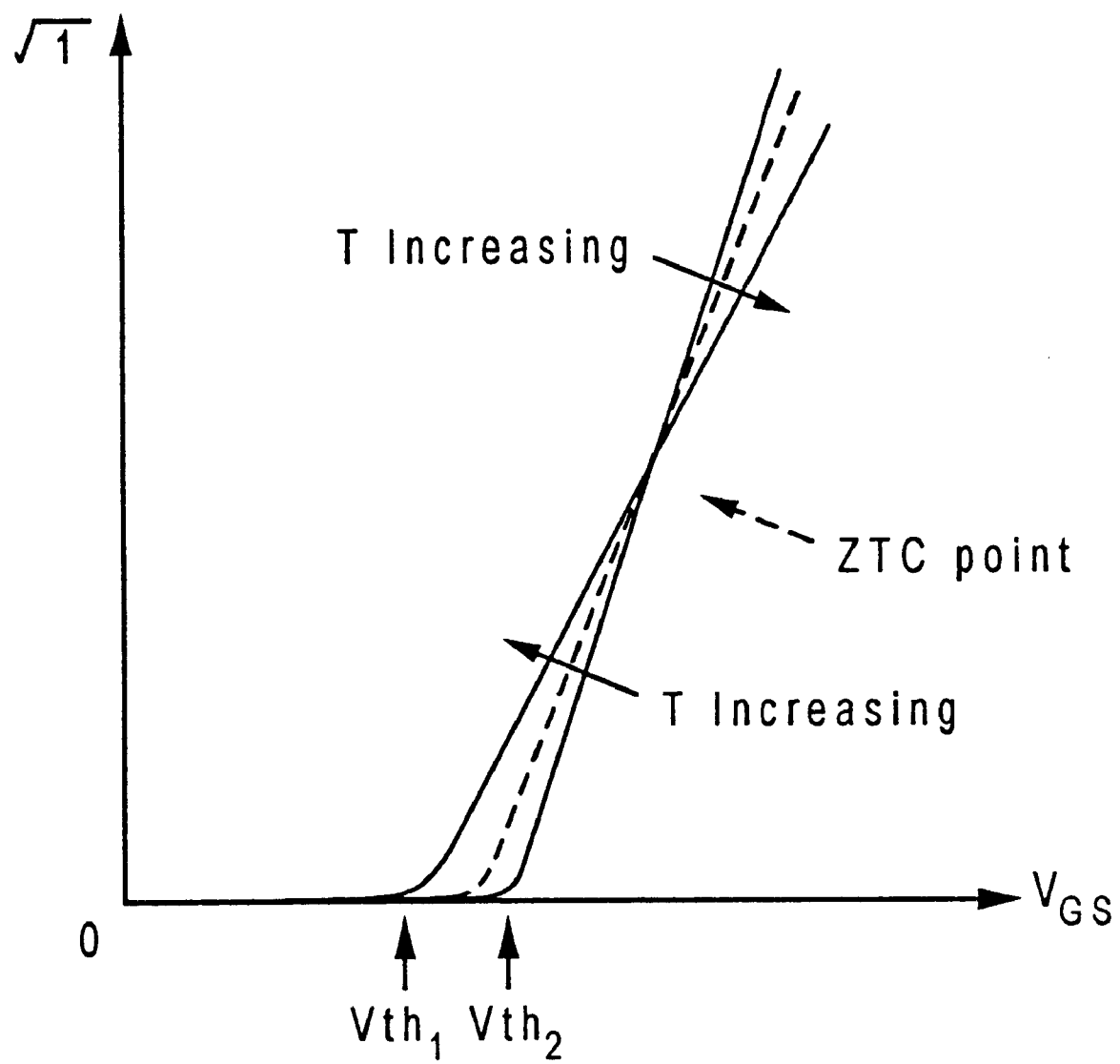
FIG. 4 is a graph, which is prior art, depicting basic operating characteristics of a MOSFET transistor depicting two different operating curves of the same MOSFET transistor at different temperatures and how the operating characteristics vary with increasing temperatures.

Referring to FIG. 4, field-effect transistors such as a MOSFET exhibit a zero-temperature coefficient (ZTC) point where the square root of the current ($\sqrt{i}$) versus voltage curves are essentially invariant with respect to temperature. Temperature characteristics of MOSFET transistors are well documented and the graph of FIG. 4 is prior art. Referring to FIG. 4, the ZTC point is labelled. If a MOSFET is biased at the ZTC current-voltage point, there will be minimal operating point variation or changes in current and voltage as the MOSFET temperature changes. For low bias currents, the threshold voltage parameter change dominates and the threshold voltage of a MOSFET lowers with increasing temperatures. A MOSFET with a high current bias level has mobility reduction, and the bias current decreases as the temperature decreases.

Referring again to FIG. 2, transistors 65 and 66 are biased below their ZTC by a constant current, therefore, a change in temperature changes the voltage drop across the transistors. Transistors 65 and 66 are biased at an operating point below their ZTC to produce a voltage on first input 11 of differential gain cell 20 which decreases with an increase in temperature. Transistor 68 is biased with a relatively large current and the voltage at second input 13 of differential gain cell 20 increases proportionally with an increase in temperature. Therefore, the voltage between first input 11 and second input 13 deviate, or further deviate, from each other when a change in temperature occurs.

In a preferred embodiment, the operating current of transistor 68 is relatively constant, therefore, the gate voltage of transistor 68 increases with temperature in accordance with FIG. 4.

Referring to FIG. 2, in a preferred embodiment, the sizes and ratios of transistors 65, 66 and 68 are designed to produce equal voltages at the inputs of differential gain cell 20 at a predicted operating temperature. In the preferred embodiment, the predetermined operating temperature is 85 degrees Celsius.

Transistors 65 and 66 are preferably biased at an operating point below their ZTC point and transistor 68 is biased at a point above its ZTC point. An alternate embodiment could make NTC reference circuit 22 insensitive to temperature by biasing transistors 65 and 66 at their ZTC point and biassing PTC reference circuit 24 above or below its ZTC to make PTC reference circuit 24 sensitive to temperature.

In a preferred embodiment, differential gain cell 20 operates as a differential amplifier. The gain and linearity of the output of differential gain cell 20 can be adjusted depending upon the application. Small variations in the operating bias of NTC reference circuit 22 and PTC reference circuit 24 are amplified by differential gain cell 20.

Current mirror 12 is implemented by transistor 56. Transistor 56 and transistor 55 have identical gate to source voltages and therefore, transistor 56 mirrors the current through transistor 55.

Figure 3A:
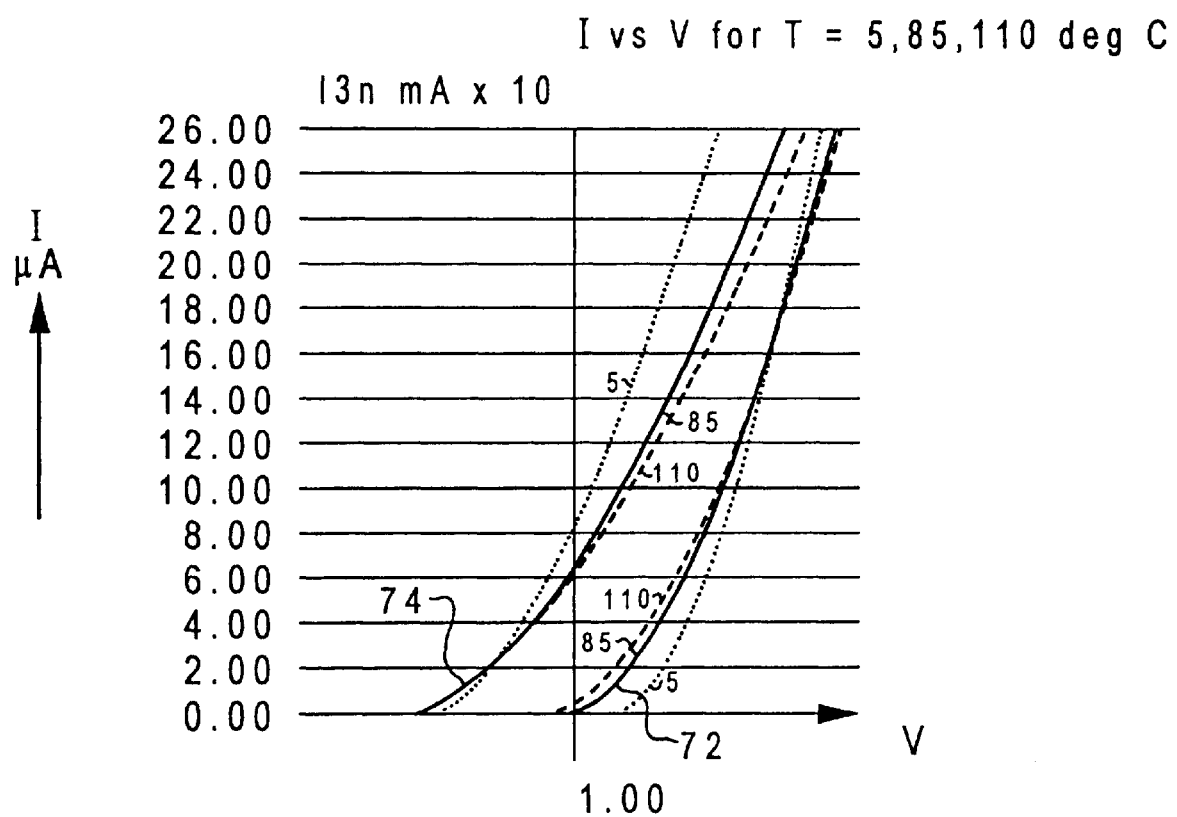
FIG. 3A is a graph of specific currents within the monitor circuit of FIG. 2 and their relationship to temperature, in accordance with a preferred embodiment.
Figure 3B:
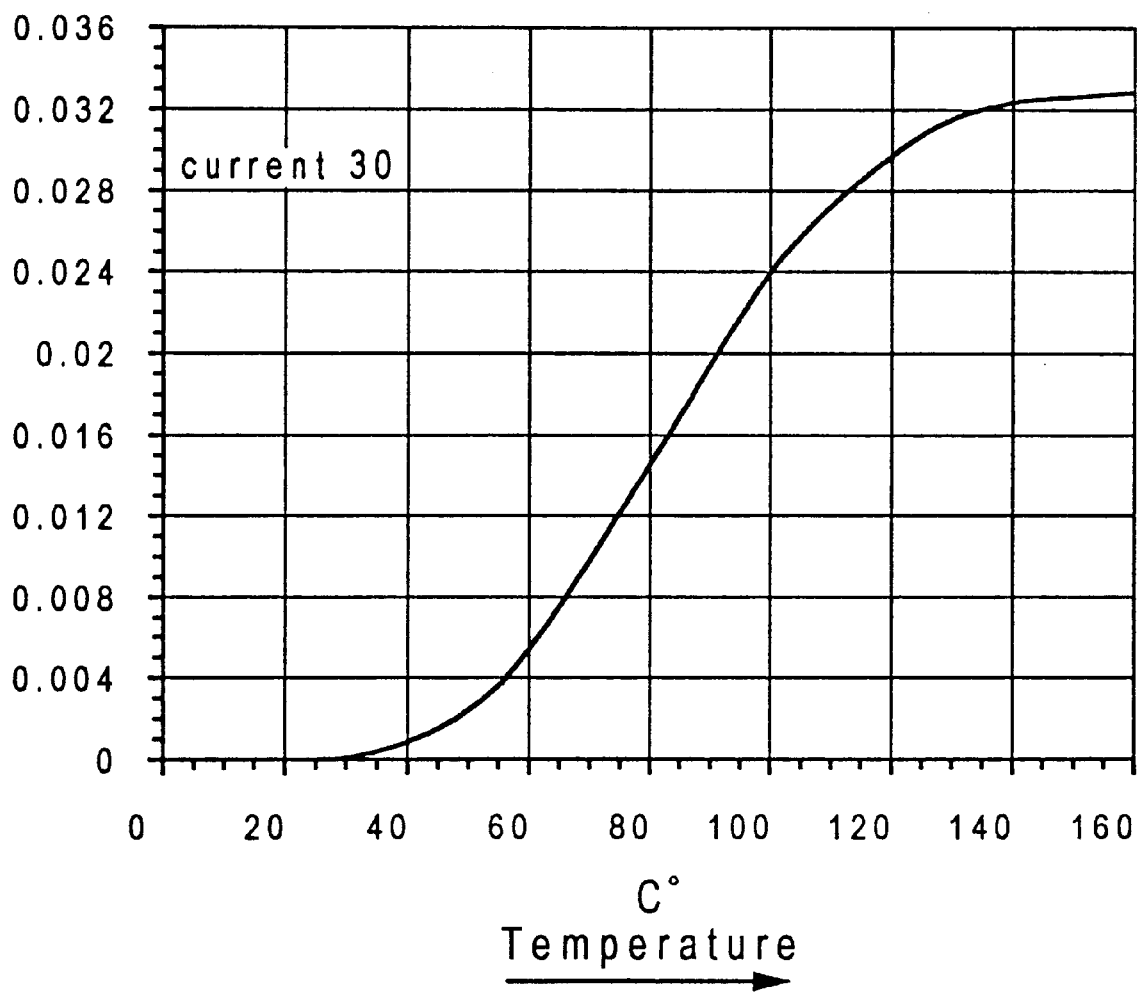
FIG. 3B is a graph of a preferred variation monitor output as a function of temperature, in accordance with FIG. 2.

Referring to FIG. 3A, current 72 of NTC reference circuit 22 is shown on the right side of the graph. The graph in FIG. 3A illustrates how PTC reference circuit 24 is temperature sensitive producing a higher voltage when supplied a constant current for increasing temperatures and how NTC reference circuit 22 produces a lower voltage with a constant current and increased temperatures.

Referring to FIG. 2, differential gain cell 20 is implemented with transistors 51 and 52. A differential gain cell load 48 is implemented by transistors 54 and 55. Transistors 54 and 55 provide equal supply impedances to transistors 51 and 52. Differential gain cell inputs 11 and 13 are coupled to the gates of transistors 51 and 52, respectively. Differential gain cell of FIG. 1 could be considered to include differential gain cell 20 and differential gain cell load 48. However, other configurations and embodiments for loading differential gain cell are possible.

In a preferred embodiment, current sink 53 sinks a constant current 16. Current 16 is supplied from transistors 51 and 52, such that current 16 is equal to the sum of the current through transistors 51 and 52. In a preferred embodiment, differential gain cell 20 produces a full swing of current from the left side (i.e., transistor 51) to the right side (i.e., transistor 52) over the desired temperature range. The left side of differential gain cell 20 supplies substantially all of current 16 at lower temperatures and the right side of differential gain cell 20 supplies substantially all of current 16 at higher temperatures. Current 30 is a mirror of the current through transistor 55. Operation of a differential gain cell is well known in the art and will not be discussed in greater detail here.

In a preferred embodiment, as illustrated by FIG. 3B, at 40 degrees Celsius relatively little current is supplied by current mirror 12. Hence, NTC reference circuit 22 is supplying a higher voltage to first input 11 of differential gain cell 20, than PTC reference circuit 24 supplies to second input 13 of differential gain cell 20. In this state, nearly all of current 16 flows through transistor 51.

As the temperature of monitor circuit 10 rises above 40 degrees Celsius to 55 degrees Celsius, PTC reference circuit 24 supplies the gate of transistor 52 with a higher voltage and current 16 begins to be shared by each of transistors 51 and 52. Respectively, NTC reference circuit 22 supplies a lower voltage to the first input 11 of differential gain cell 20 in response to increasing temperatures. Further, as the temperature of monitor circuit 10 increases to 130 degrees Celsius, PTC reference circuit 24 supplies a significantly stronger signal, or higher voltage to differential gain cell 20 and PTC reference circuit 24 supplies a much lower voltage to second input 13 of differential paid 20. Consequently, nearly all of current 16 is supplied by transistors 55 and 52 at the highest operational temperature.

As depicted by graph of FIG. 3B, a preferred embodiment provides a substantially linear output of current to temperature in the temperature range from 40 to 130 degrees Celsius. In alternate embodiments the linear portion of the current to temperature output may be non-linear or shifted to a higher or a lower temperature range. Additionally, an application circuit may only use a small portion of the temperature range depicted in the graph of FIG. 3B. One skilled in the art can appreciate that an infinite number of output-to-temperature responses or functions with varying magnitudes could be accomplished by monitor circuit 10 without departing from the scope of the present invention.

As depicted in FIG. 3A and FIG. 2, the slopes of currents 72 and 74 as well as the bias points and threshold voltages of transistors 65, 66 and 68 create the temperature sensitivity of monitor circuit 10. Three different operating temperatures, the minimum, nominal, and maximum operating temperatures are depicted in FIG. 3A for currents 72 and 74. The operating curves for 5, 85 and 110 degrees Celsius are illustrated for currents 72 and 74. FIG. 3A illustrates a small deviation in the operating curves of transistors 65 and 66 (current 72) with relationship to temperature and a relatively wide variation in the operating curve of transistor 68 (current 74) with relation to temperature. Specifically, for a constant current of 10 uA, the change in temperature moves the operating point horizontally on the voltage axis.

In a preferred embodiment, monitor circuit 10 is utilized in the region of the FIG. 3B graph where current 30 reaches a steady state. The graph depicted in FIG. 3B, illustrates current 30 substantially linear in the temperature range from 40 Celsius to 130 Celsius.

The output of monitor circuit 10 is very adaptable. The signal or current produced by monitor circuit 10 can be adapted to a desired application by selecting an operating point which accentuates a variable such as a critical temperature range. Additionally, the output signal could be realized by a voltage. Signal intensity or the amount of current or voltage produced by monitor circuit 10 can be altered by the addition of an amplifier (not shown) or accomplished utilizing current mirrors. The slope of current in relation to temperature may be controlled by the gain of differential gain cell 20 or an external amplifier (also not shown). Additionally, the width-to-length ratio of devices driving differential gain cell 20 can change the slope of the graph of FIG. 3B. Scaling or filtering can also be utilized to shape the basic response of the monitor circuit 10 output.

Figure 5:
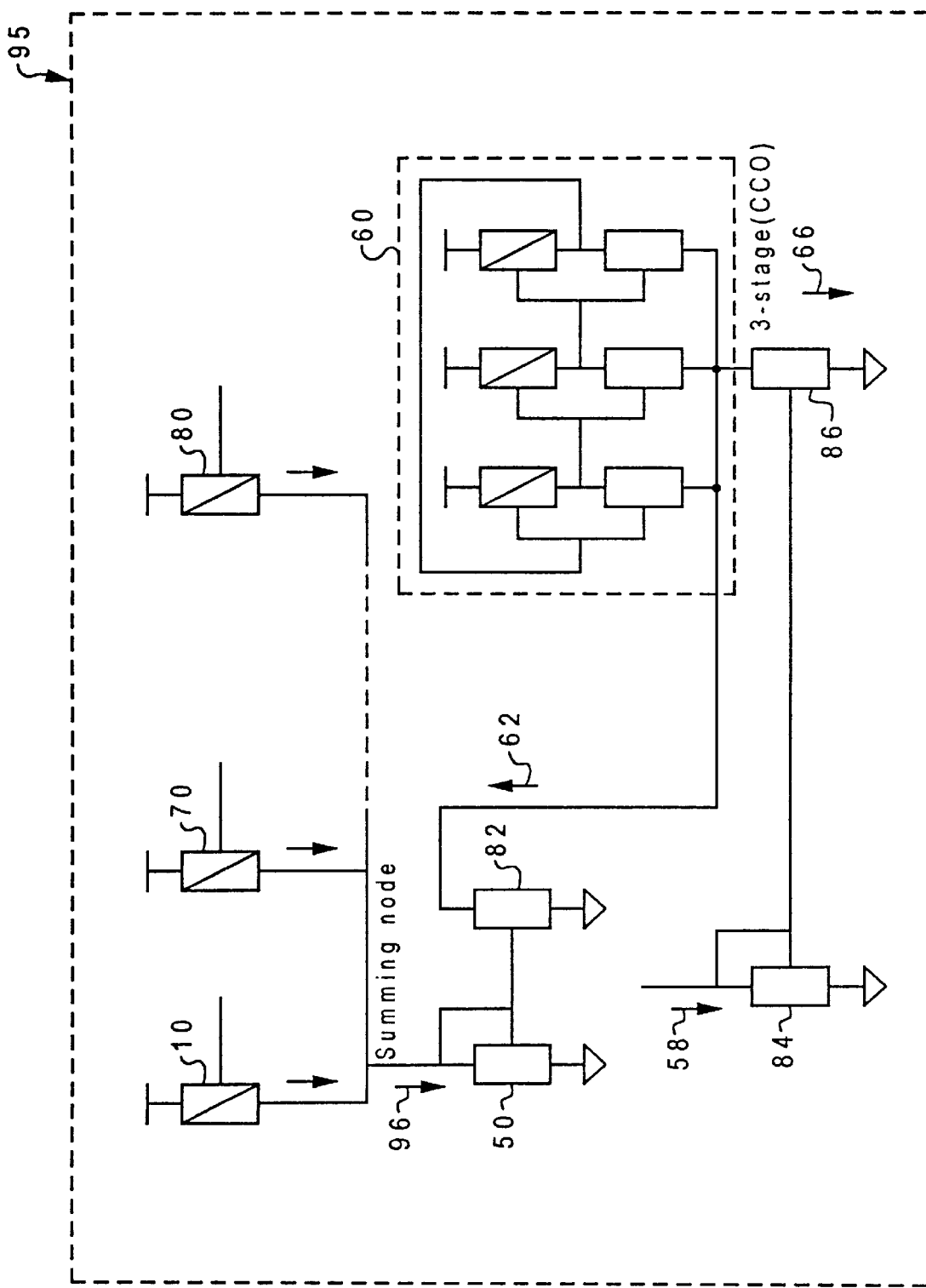
FIG. 5 is a schematic diagram depicting an application which can effectively utilize the monitor circuit output, a CMOS process compensation circuit, in accordance with the present invention.

FIG. 5 depicts an application which can effectively use the output of monitor circuit 10. In a preferred embodiment of temperature compensating circuit 95, a plurality of monitor circuits including those designated 10, 70 and 80, each supply a portion of current 96 to summing node 50. Current 96 is mirrored by current 62 of current mirror 82. Current 62 alters the bias of the current controlled oscillator (CCO) 60. Each monitor can provide compensation for individual variations as a result of uncontrollable parameters or variables, such as temperature or the fabrication process. However, a single monitor may be used to provide compensation to current controlled oscillator 60.

In the embodiment of FIG. 5, current controlled oscillator 60 is realized by three stages. Current controlled oscillator 60 is biased by current source 86. Current source 86 mirrors reference device 84 which conducts a reference current 58. Reference current 58 is preferably an order of magnitude larger than the total of current 96.

In summary, compensation currents which are related to threshold voltage offsets temperature and other changing parameters are supplied to summing node 50. The current through summing node 50 is mirrored by current mirror 82. Current controlled oscillator 60 is biased by current source 86 which mirrors reference device 84. Current mirror 82 can complement or deduct from bias current 66. Compensation current 62 changes the bias point of current controlled oscillator 60 and compensates for a plurality of variations by detecting actual device operating variations. For a more in depth description of a circuit, which can effectively utilize the output of monitor circuit 10, refer to the cross referenced copending U.S. patent application Ser. No. 08/901,298.

Referring back to FIG. 2, in a preferred embodiment, transistor 51 is driven by a circuit which produces a drop in output voltage in response to temperature increases, and transistor 52 is driven from a circuit which produces an increase in voltage due to an increase in temperature. In an alternate embodiment, NTC reference circuit 22 and PTC reference circuit 24 may both produce an increasing signal in response to increasing temperature. Utilizing two such temperature sensitive reference circuits could provide an output current with a nonlinear response. However, at least one of the reference circuits must provide a signal which varies with temperature.

While the invention has been particularly shown and described with reference to a preferred embodiment, it will be understood by those skilled in the art that various changes in form and detail may be made therein without departing from the spirit and scope of the invention.

What is claimed is:

1. A monitoring circuit for monitoring an environmental operating parameter within an integrated circuit, said monitoring circuit for providing a current output signal which is responsive to said parameter, said monitoring circuit comprising:

a differential gain cell having a first input and a second input, coupled to a first transistor and a second transistor respectively, said differential gain cell biased by a source which is unaffected by changes in said parameter;

a first sensing circuit for providing a first signal to said first input of said differential gain cell in response to changes in said parameter; and a second sensing circuit for providing a second signal to said second input of said differential gain cell in response to said changes in said parameter, wherein said first signal deviates from said second signal responsive to said changes in said parameter of said integrated circuit, such that said differential gain cell decreases a first current through said first transistor and increases a second current through said second transistor to produce said signal in response to said changes in said parameter.

2. The monitoring circuit according to claim 1, wherein said first signal increases with increasing temperature and said second signal decreases with increasing said temperature.

3. The monitoring circuit according to claim 1, wherein said first sensing circuit is biased above a zero temperature coefficient operating point and said second circuit is biased below said zero temperature coefficient operating point, wherein said zero temperature coefficient operating point represents a point where operation of said circuit is invariant with changes in said temperature.

4. The monitoring circuit according to claim 1, further comprising a current mirror coupled to said second transistor of said differential gain cell, said current mirror for replicating said second current in said second transistor.

5. The monitoring circuit according to claim 1, wherein said output signal is current based.

6. The monitoring circuit according to claim 1, wherein said output signal is voltage based.

7. The monitoring circuit according to claim 1, wherein said first sensing circuit is temperature insensitive and said second sensing circuit is temperature sensitive.

8. The monitoring circuit according to claim 1, wherein said parameter of said integrated circuit is temperature.

9. The monitoring circuit according to claim 1, wherein said first sensing circuit is biased at a zero temperature coefficient operating point and said second sensing circuit is not biased at said zero temperature coefficient operating point.

10. The monitoring circuit according to claim 1, wherein an amplitude of said output signal is proportional to changes in temperature of said integrated circuit.

11. The monitoring circuit according to claim 1, wherein said biased source is comprised of a bias control circuit coupled to said different gain cell and which operates to stabilize said differential gain cell.

12. A temperature monitoring circuit for an integrated circuit, comprising:

first sensing circuit having a first operating point at which a transistor within said circuit is on;

a second sensing circuit having a second operating point which varies with respect to said first operating point of said first sensing circuit over a predetermined temperature range, said second sensing circuit being responsive to changes in temperature of the integrated circuit; and a differential gain cell coupled to said first reference circuit and said second reference circuit such that said differential gain cell produces a current signal which varies in response to said changes in the temperature of the integrated circuit.

13. The temperature monitoring circuit according to claim 12, wherein said first reference circuit is temperature insensitive and said second reference circuit is temperature sensitive.

14. The temperature monitoring circuit according to claim 12, wherein said first reference circuit is biased above a zero temperature coefficient operating point and said second reference circuit is biased below said zero temperature coefficient operating point wherein said zero temperature operating point represents a point where operation of said circuit is invariant with said changes in temperature.

15. The temperature monitor according to claim 12, further comprising a current mirror coupled to said differential gain cell, said current mirror for replicating a current in said differential gain cell.

16. A monitoring circuit for monitoring an environmental operating parameter within an integrated circuit for providing a current signal which is responsive to said parameter, said monitoring circuit comprising:

a differential gain cell within an integrated circuit having a first input and a second input;

a first sensing circuit within said integrated circuit for providing a first signal to said first input of said differential gain cell in response to changes in said parameter;

a second sensing circuit within said integrated circuit for providing a second signal to said second input of said differential gain cell in response to said changes in said parameter, wherein said first signal has a predetermined relationship with said second signal and said first signal deviates from said second signal in response to said changes in said parameter; and a differential gain cell load circuit within said integrated circuit for providing a differential current to said differential gain cell, wherein said first sensing circuit and said second sensing circuit alter said differential current of said differential gain cell in response to said changes in said parameter so that said different gain cell produces said current signal in response to said changes in said parameter.

17. The monitoring circuit according to claim 16, further comprised of a start-up circuit.

18. The monitoring circuit according to claim 16, further comprised of a bias control circuit coupled to said differential gain cell and operates to stabilize said monitoring circuit over temperature.

* * * * *